United States Patent [19]

Gururaja et al.

[11] Patent Number: 5,345,139
[45] Date of Patent: Sep. 6, 1994

[54] ELECTROSTRICTIVE ULTRASONIC PROBE HAVING EXPANDED OPERATING TEMPERATURE RANGE

[75] Inventors: Turuvekere R. Gururaja, North Andover, Mass.; Joseph Fielding, State College, Pa.; Thomas R. Shrout, State College, Pa.; Sei-Joo Jang, State Collete, Pa.

[73] Assignee: Hewlett-Packard Company, Palo Alto, Calif.

[21] Appl. No.: 113,450

[22] Filed: Aug. 27, 1993

[51] Int. Cl.$^5$ .................... H01L 41/87; C04B 35/46
[52] U.S. Cl. .................... 310/358; 310/346; 252/62.9
[58] Field of Search ............ 310/346, 357, 358; 252/62-69, 62.9 R, 62.9 PZT

[56] References Cited

U.S. PATENT DOCUMENTS

| | | | |
|---|---|---|---|
| 4,712,156 | 12/1987 | Bardhan | 361/321 |
| 4,736,631 | 4/1988 | Takeuchi et al. | 73/649 |
| 4,940,681 | 7/1990 | Ushida et al. | 252/62.9 |
| 5,032,558 | 7/1991 | Bailey et al. | 501/137 |
| 5,135,897 | 8/1992 | Uchino et al. | 252/62.9 |
| 5,188,992 | 2/1993 | Nishimura et al. | 252/62.9 |
| 5,210,455 | 5/1993 | Takeuchi et al. | 310/328 |
| 5,219,810 | 6/1993 | Furuya et al. | 501/136 |

FOREIGN PATENT DOCUMENTS 2094579 2/1990 Japan.
2059716B 9/1980 United Kingdom ........ H04R 17/00

OTHER PUBLICATIONS

"Electrostrictive Materials For Ultrasonic Probes," Masuzawa et al., Japanese Journal of Applied Physics, vol. 28, (1989) Supplement 28-2, pp. 101-104.

"Dielectric And Piezoelectric Properties Of Lanthanum-Modified Lead Magnesium Niobium-Lead Titanate Ceramics," Huebner et al., Ferroelectrics, 1989, vol. 93, pp. 341-349.

"Relaxor Ferroelectric Transducers," Takeuchi et al., Central Research Laboratory, Hitachi, Ltd., Kokubunju, Tokyo 185, Japan.

Primary Examiner—Steven L. Stephan

[57] ABSTRACT

An ultrasonic electrostrictive transducer for transmitting and receiving ultrasonic energy and having an expanded operating temperature range, preferably about room temperature. The transducers may be made from PMN-PT solid solutions having select mole percentages of PT and being doped with La, whereby the operating temperature range about a given operating temperature may be effectively doubled.

12 Claims, 9 Drawing Sheets

ELECTROSTRICTIVE ULTRASONIC PROBE HAVING EXPANDED OPERATING TEMPERATURE RANGE

FIELD OF THE INVENTION

This invention relates to ultrasonic transducers and, more particularly, to an ultrasonic transducer made from a relaxor ferroelectric solid solution which provides an expanded operating temperature range, preferably in the vicinity of room temperature.

BACKGROUND OF THE INVENTION

Ultrasonic transducers, which transmit and receive ultrasonic waves, enable one to view the interior of an object noninvasively. They have a wide variety of applications—a major use being ultrasonic imaging of the human body as a medical diagnostic tool.

Ultrasonic transducers utilize piezoelectric properties to convert electrical energy into mechanical energy (i.e., an electrical signal applied to the transducer generates a mechanical sound wave which is sent into the body), and vice versa, convert mechanical energy back into. electrical energy (i.e., the sound wave reflected off an internal organ is converted back to an electrical signal and sent to an imaging device). The more efficiently the transducer performs This energy conversion, the stronger the signal. Two important measures of the strength and sensitivity of the transducer material are the electromechanical coupling factor $k_t$ and dielectric constant K.

Another important factor in medical ultrasonic imaging is the stability and reproducability of the response over the operating temperature range. Medical transducers are intended to operate at room temperature (i.e., about 25° C.). However, in practice the temperature in the room may actually be much lower (e.g., 15° C. or lower), and the probe may heat up during normal use to a much higher temperature (e.g., 40° C. and above). These temperature variations can have a substantial effect on the transducer output for materials whose electromechanical properties are temperature dependent.

Ultrasonic transducers for medical applications have been fabricated from piezoelectric materials such as lead zirconate titanate (PZT) ceramics. It is also known to fabricate transducers from a material which is highly polarizable by application of a D.C. bias voltage, the material thereby exhibiting piezoelectric properties. The material loses its polarization upon removal of the D.C. bias voltage and no longer exhibits piezoelectric properties. This property of tuning the piezoelectric effect ON or OFF by the presence or absence of a D.C. bias voltage can be observed, for example, in materials which are preferably maintained in the vicinity of their ferroelectric to paraelectric phase transition temperatures. The ferroelectric phase exhibits piezoelectric properties whereas the paraelectric phase does not. Materials having the above described D.C. bias voltage dependent properties are referred to herein as "electrostrictive" materials.

Conventional ultrasonic transducers use piezoelectric materials which exhibit a remanence in polarization after the applied D.C. bias is removed. Thus the piezoelectric activity and consequently the sensitivity of the transducer is a constant, and does not change appreciably with temperature. However, using an electrostrictive material, one can provide a transducer with controllable sensitivity which makes it suitable for such applications as a variable aperture probe, e.g., wherein an ultrasonic beam is electronically scanned in the X-direction and controlled in the Y-direction by a bias voltage. Another application is a two-dimensional array, e.g., a crossed-array electrode type 2D probe, wherein the piezo-active region can be selected in space and in time by D.C. bias field switching and a selected region is mechanically isolated by a passive polymer.

Several material families have been evaluated as potential candidates for electro-strictire transducer application. Two examples of such materials include lead-magnesium-niobate modified with lead titanate (PMN-PT), and barium-strontium-titanate (BST). The temperature dependence of polarization and dielectric constant for these different electrostrictive materials is illustrated in FIGS. 1-2.

Figure 1:
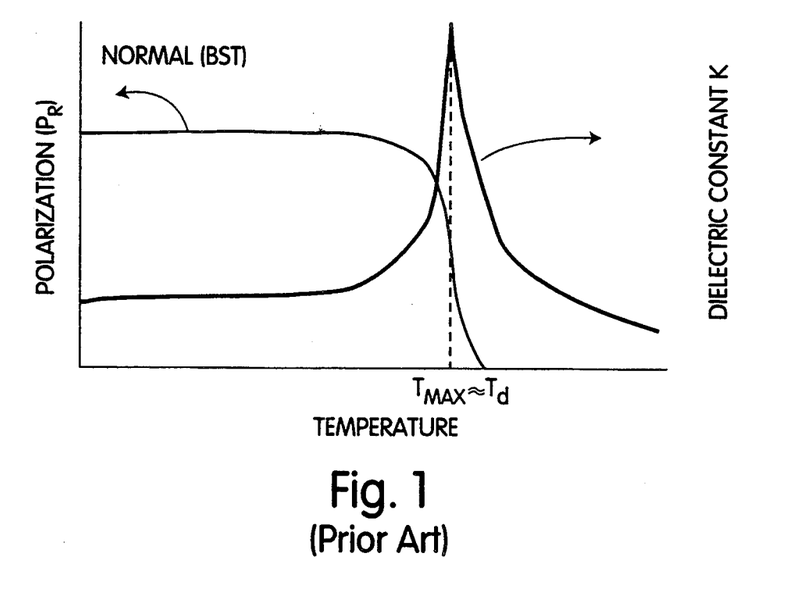
FIG. 1 is a graph showing the temperature dependence of the remanent polarization $P_R$ and dielectric constant K for a "normal" ferroelectric material (BST)
Figure 2:
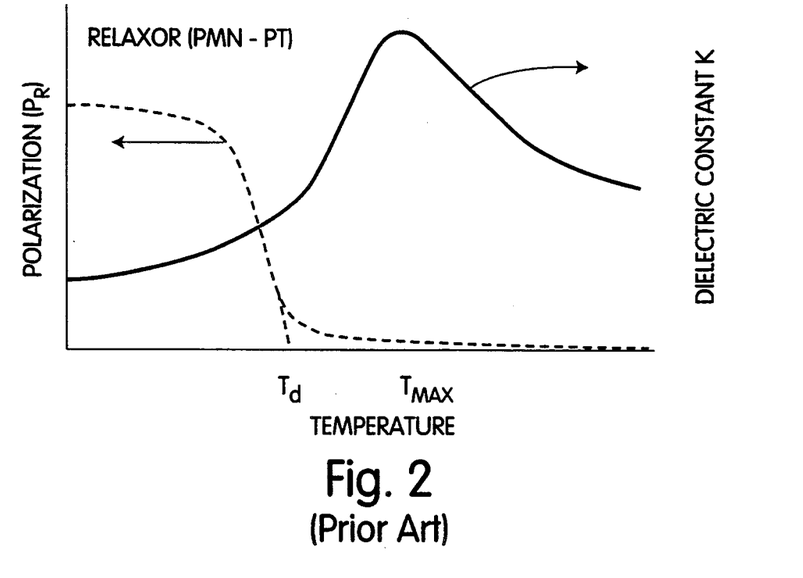
FIG. 2 is a graph showing the temperature dependence of the remanent polarization $P_R$ and dielectric constant K for a "relaxor" ferroelectric material (PMN—PT)

The temperature dependent behavior of BST is illustrated in FIG. 1. This is a material having "normal" ferroelectric behavior, that is, the temperature of the dielectic maxima $T_{max}$ substantially coincides with disappearance of polarization $T_d$. Thus below $T_{max}$, BST exhibits a stable remanent polarization after the applied D.C. bias is removed. Such remanence in polarization defeats the goal of providing a transducer with controllable sensitivity. To operate above $T_{max}$, BST requires a relatively large electric field to achieve the required polarization and is thus difficult to make into a practical device where the goal is to minimize the field applied to the transducer from the consideration of patient safety.

Another type of electrostrictive material is a "relaxor" ferroelectric, e.g., PMN—PT. In relaxor ferroelectric materials, the temperature of the dielectric maxima $T_{max}$ is substantially higher than the temperature corresponding to the disappearance of polarization $T_d$. Thus, the operating temperature range for a PMN—PT type of material is between $T_d$ and $T_{max}$ as illustrated in FIG. 2. PMN is a relaxor material having a diffuse phase transition, which produces a broadened dielectric maxima. PT, a normal ferroelectric, forms a solid solution with the relaxor PMN; the amount of PT can be increased to increase $T_{max}$. However, this does not increase the operating temperature range, but simply shifts it upwardly. A PMN—PT solid solution having approximately 90 mole % PMN and 10 mole % PT has been proposed for use as an ultrasonic transducer, having an operating temperature range of about 25° C. around room temperature (i.e., a $T_d$ of 15° C. and $T_{max}$ of 40° C.). However, this may not be sufficient for use in a much cooler room, or when the device heats up.

It is an object of this invention to provide an electrostrictive transducer material having an expanded operating temperature range, and relatively small variations of sensitivity with temperature.

SUMMARY OF THE INVENTION

An electrostrictive material has been found having a broad operating temperature range, which range may be in the vicinity of room temperature, making it very suitable for ultrasonic transducer applications. The material comprises a select composition range of lanthanum doped PMN-PT solid solutions, and the resulting operating range may be effectively doubled to about 48° C. The doping will provide an ample margin on each side of a desired operating temperature, for example room temperature (25° C.). This select composition range also provides lower variations in transducer sensitivity with temperature than prior art materials used in the fabrication of electrostrictive transducers.

Compositions suitable for use in practicing this invention include a solid solution of lead magnesium niobate PMN and lead titanate PT which is doped with lanthanum La in accordance with the following formula I:

$$Pb_{1-(3/2)y}La_y\square_{y/2}[(Mg_{1/3}Nb_{2/3})_{1-x}Ti_x]O_3 \qquad (I)$$

wherein x and y are on the order of
$10 \leq x \leq 30$ mole %
$0.5 \leq y \leq 3$ mole %
and $\square$ represents a vacancy at the Pb site.

By varying x, which represents the PMN:PT ratio within formula I, there is a resulting change in temperature $T_{max}$, and a change in the optimum amount of lanthanum doping and resulting operating range. For transducers having an expanded operating temperature range around room temperature, (i.e., about 25° C.) the preferred ranges are selected from the following:

(a) y on the order of 1 mole % and x is on the order of 12.5–17.5 mole %;

(b) y on the order of 2 mole % and x is on the order of 17–22 mole %; and (c) y on the order of 3 mole % and x is on the order of 23–28 mole %.

A specific preferred composition described in this application has on the order of $x=15$ mole % PT and on the order of $y=1$ mole % La, and exhibits a 48° C. operating range of from $-7°$ C. to 41° C.

Another specific composition, having a lower temperature limit, has on the order of $x=13.5$ mole % PT and on the order of $y=1$ mole % La, and exhibits a 46° C. operating range of from $-15°$ C. to 31° C.

Still another specific composition, having a higher temperature limit, has on the order of $x=17.5$ mole % PT and on the order of $y=1$ mole % La, and exhibits a 33° C. operation range of from 18° C. to 55° C.

In another aspect of the invention there is provided a method of expanding the operating temperature range of an electrostrictive transducer, wherein the mole % of PT and mole % of La are selected to produce the combined lower and upper limits of a broadened operating temperature range for a particular transducer application.

DETAILED DESCRIPTION

According to the present invention, an electrostrictive material is provided consisting of a select range of lanthanum doped PMN—PT solid solutions which enable the production of an ultrasonic probe having an expanded operating temperature range and reduced temperature sensitivity. In order to illustrate the problem of temperature sensitivity, FIGS. 3-5 show the temperature dependence of various properties of a PMN—PT system.

Figure 3:
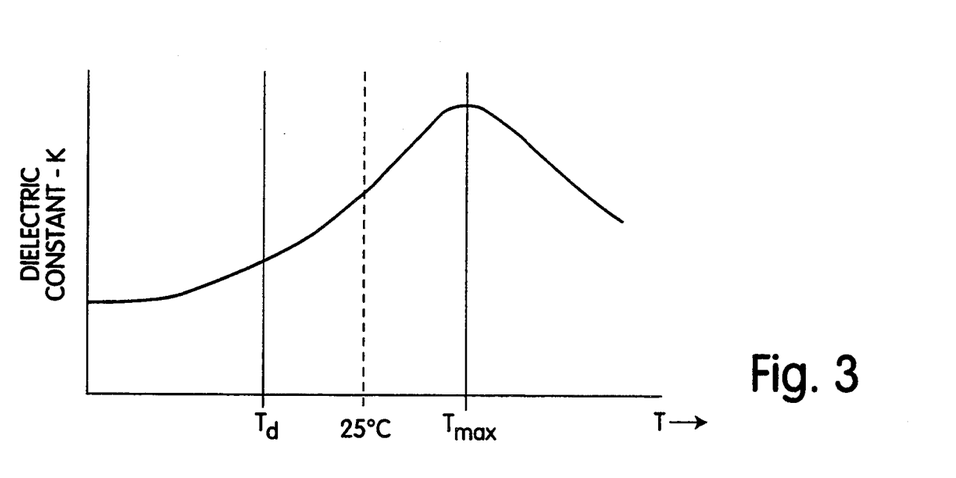
FIG. 3 is a graph of the dielectric constant K versus temperature for PMN—PT.

FIG. 3 shows the variation of dielectric constant K with temperature T. Note that K has a relatively broad (diffuse) peak centered at $T_{max}$.

Figure 4:
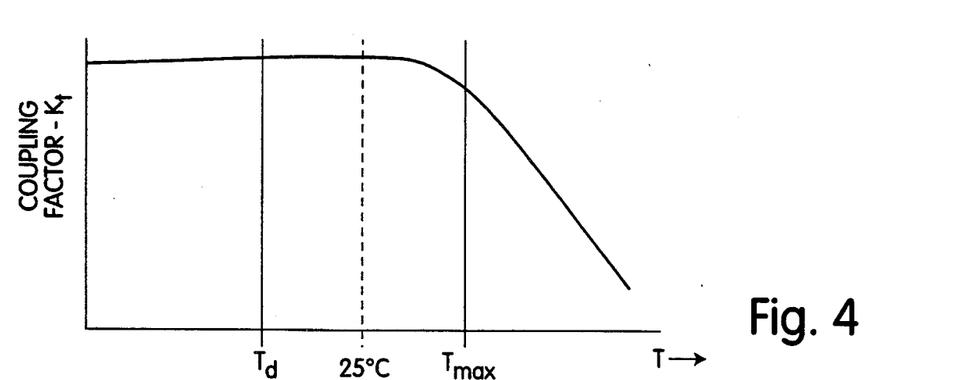
FIG. 4 is a graph of the thickness coupling coefficient $k_t$ versus temperature for PMN—PT at a given D.C. bias.

FIG. 4 shows the variation in thickness coupling coefficient $k_t$ at a given D.C. bias with temperature T. The coupling coefficient is relatively constant at lower temperatures, and then drops off near $T_{max}$. For optimum coupling efficiency and highest sensitivity, it would be desirable to operate below $T_{max}$.

Figure 5:
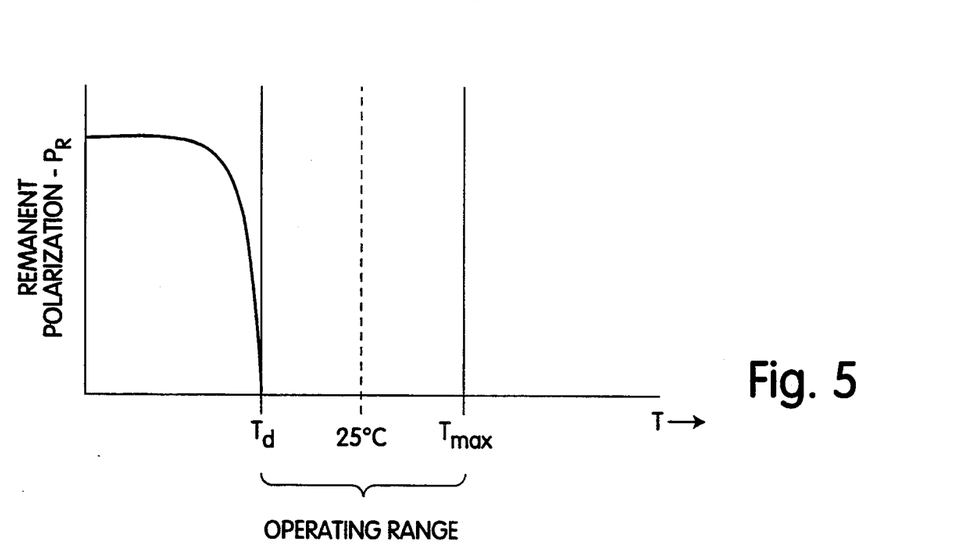
FIG. 5 is a graph of the remanent polarization $P_R$ versus temperature for PMN—PT.

FIG. 5 shows the remanent polarization $P_R$ as a function of temperature. The remanent polarization drops off at $T_d$. Zero remanent polarization is desired for a transducer which can be switched ON and OFF without hysteresis. Thus, it would be desirable to operate above $T_d$ to utilize the tunable sensitivity in an electrostrictive transducer.

From the above considerations, it is clear that the operating temperature range for an electrostrictive material is between $T_{max}$ and $T_d$.

Figure 6:
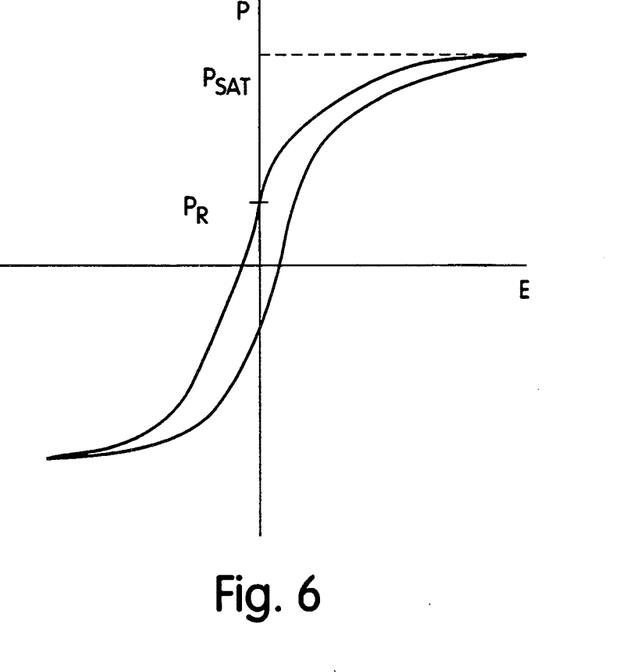
FIG. 6 is a graph showing hystersis (remanent polarization) in PMN—PT when the electric field is withdrawn.

FIG. 6, a plot of polarization P versus electric field E, shows a material having undesirable hysteresis (remanent polarization) at the operating temperature. As the electric field is increased, the domains are organized and the polarization increases until it saturates at $P_{sat}$.

Figure 7:
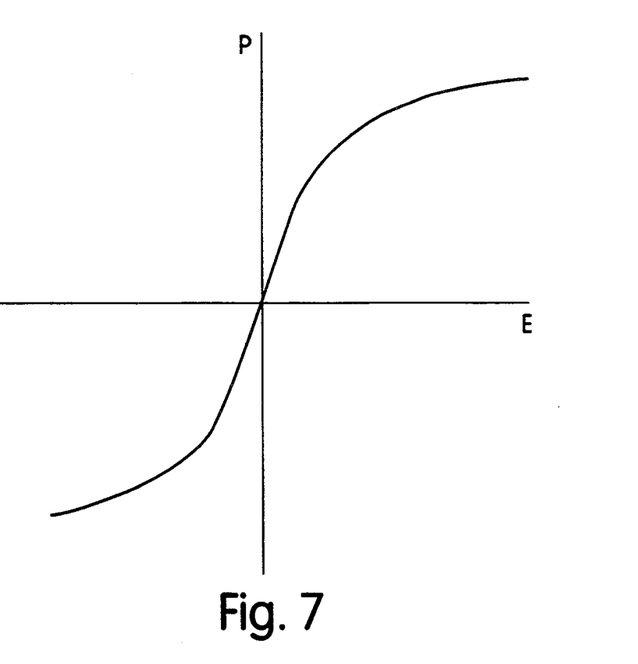
FIG. 7 is a graph showing substantially no hysteresis in PMN—PT when the electric field is withdrawn.

When the electric field is removed, the polarization does not return to zero but rather a remanent polarization $P_R$ remains, i.e., the transducer cannot be fully turned off. In contrast with FIG. 6, the desired non-hysteresis behavior is shown in FIG. 7. Here when the electric field is turned off, the polarization returns to zero. There is complete control (and reproducibility) over the polarization by changing the applied field.

It would be desirable to expand the operating temperature range ($T_{max} - T_d$) where the material exhibits a fully controllable and reproducible polarization (between ON, OFF and a variable amplitude therebetween). It has been suggested to raise $T_{max}$ by increasing the mole % of PT. However, this just shifts the operating range higher, without expanding it.

In accordance with this invention it has been found that the operating temperature range of an electrostrictive ultrasonic transducer can be expanded by fabricating the transducer from a PMN—PT solid solution that has been doped with lanthanum. In a specific embodiment, 1 mole % La is added to various PMN:PT compositions as set forth in the following Table 1, to provide the designated increase in operating temperature range (i.e., $T_{max} - T_d$). The thickness coupling coefficient $k_t$ as set forth in Table 1 was measured at two applied field strengths (5 kV/cm and 10 kV/cm), and at three operating temperatures (0°, 25° and 50° C.). The remanent coupling factor $k_{trem}$ (with zero applied field) was also measured, along with the saturation field $E_{sat}$. The data from Table 1 is plotted in FIGS. 8–10.

Figure 10:
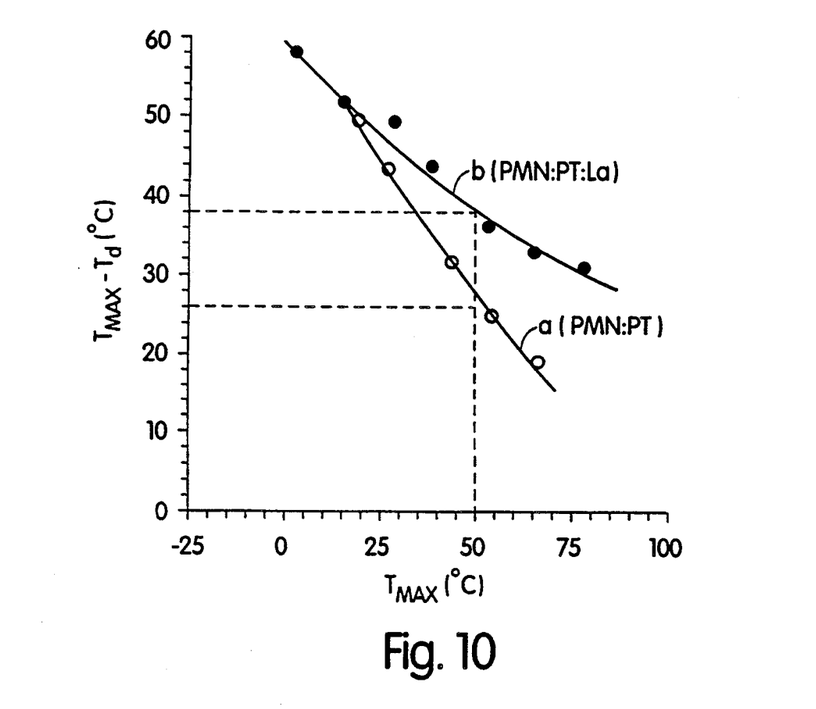
FIG. 10 is a graph of $T_{max}$ vs. $T_{max} - T_d$ for PMN—PT with and without 1 mole % La, showing that for a given $T_{max}$, say 50° C., there is a significant difference in $T_{max} - T_d$.

FIG. 10 compares the operating temperature range ($T_{max} - T_d$) to $T_{max}$ for the same prior art and inventive compositions (curves a and b respectively). For a defined $T_{max}$ of 50° C. as shown, the operating range of the composition of this invention (curve b) is substantially greater than that of curve a.

Figure 11:
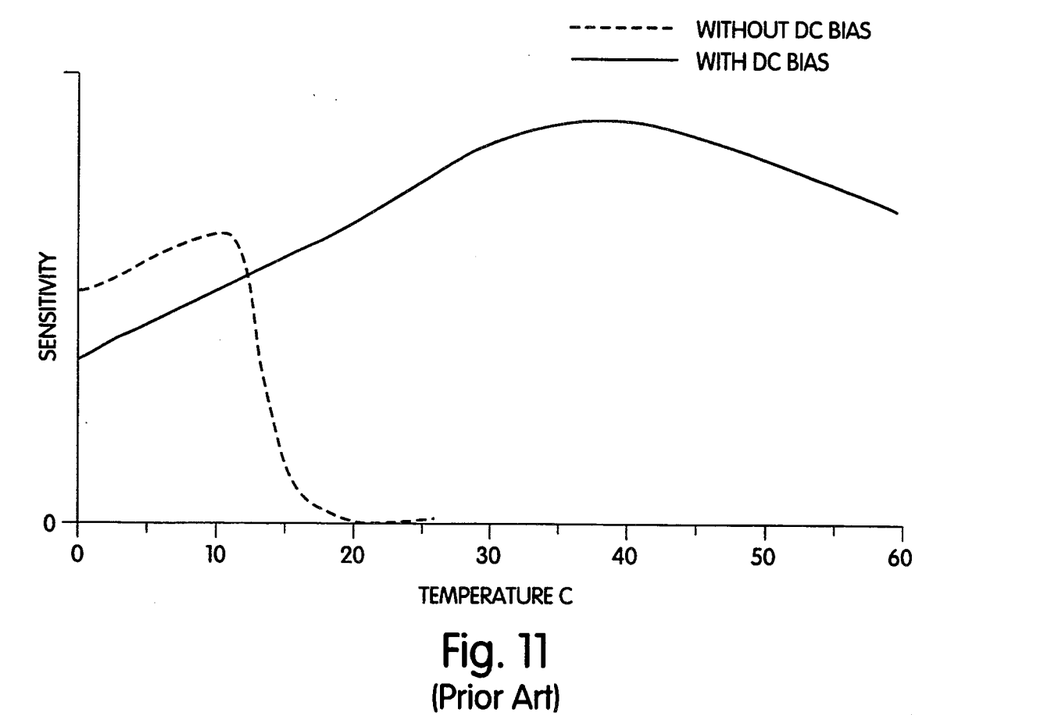
FIG. 11 is a graph showing the sensitivity change with temperature for a prior art PMN—PT composition with and without D.C. bias; note that the remanence in sensitivity exists up to 20° C.

FIG. 11 is a graph showing the sensitivity change with temperature for the same prior art PMN—PT composition (PMN:PT of 90:10) with and without D.C. bias. There is an undesirable remanence in sensitivity up to about 20° C. Also, there is a significant undesirable variation in sensitivity with temperature (with D.C. bias).

Figure 12:
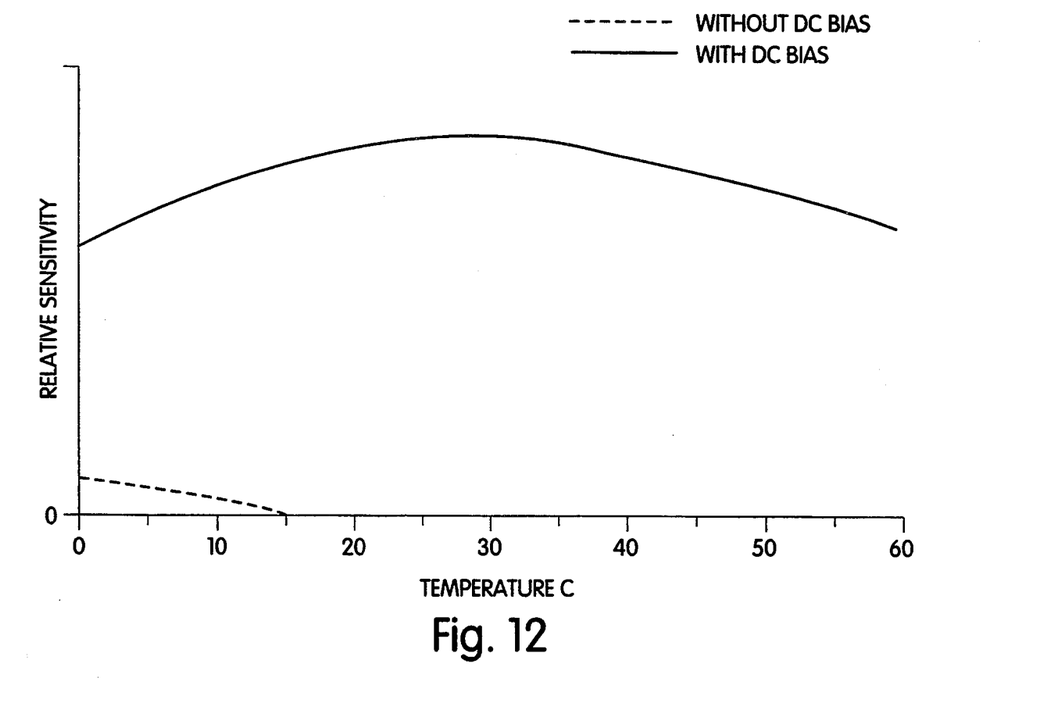
FIG. 12 is a graph showing the greatly reduced sensitivity change with temperature for a PMN—PT composition of this invention with and without D.C. bias; note that the remanance in sensitivity (w/o D.C. bias) is pushed to a lower temperature.

FIG. 12 illustrates the significant improvement in performance, compared to the compound described in FIG. 11, of a preferred composition of this invention (PMN:PT:La of 85:15:1) in the vicinity of room temperature. The remanence (without D.C. bias) is pushed to a lower temperature (about 15° C.). The level of remanance relative to sensitivity with DC bias is substantially small even at 0° C. For the prior art composition (FIG. 11), the sensitivity without DC bias (remanant sensitivity) is higher than the sensitivity with DC bias up to approximately 13° C. In contrast, for the composition of this invention (FIG. 12) the sensitivity curve (with D.C. bias) is substantially flatter, signifying a more constant relative pulse-echo sensitivity over an expanded operating temperature range in the vicinity of room temperature.

The compositions were made and tested as substan-

TABLE 1

Field-Induced Thickness Coupling Factor $k_t$ Data for PMN-PT Compositions With 0 and 1 Mole % La at 0, 25 and 50° C.

| | | | | | | 0° | | | | 25° | | | | 50° | | |
|---|---|---|---|---|---|---|---|---|---|---|---|---|---|---|---|---|
| Sample | y mole % La | x mole % PT | $T_d$ °C. | $T_{max}$ °C. | $T_{max} - T_d$ °C. | $k_t$ 5 kV/cm | $k_t$ 10 kV/cm | $k_{trem}$ | $E_{sat}$ (kV/cm) | $k_t$ 5 kV/cm | $k_t$ 10 kV/cm | $k_{trem}$ | $E_{sat}$ (kV/cm) | $k_t$ 5 kV/cm | $k_t$ 10 kV/cm | $k_{trem}$ | $E_{sat}$ (kV/cm) |
| a) | 0 | 0.10 | 15 | 40 | 25 | 0.43 | 0.45 | 0.40 | 2–3 | 0.48 | 0.48 | 0 | 3–4 | 0.37 | 0.44 | 0 | 5–6 |
| b) | 0 | 0.125 | 30 | 52 | 22 | 0.41 | 0.43 | 0.40 | 2–3 | 0.46 | 0.45 | 0.37 | 3–4 | 0.44 | 0.49 | 0 | 6 |
| c) | 0 | 0.15 | 48 | 68 | 20 | 0.45 | 0.46 | 0.42 | 3 | 0.46 | 0.47 | 0.42 | 3 | 0.47 | 0.48 | 0 | 3–4 |
| d) | 1 | 0.125 | −20 | 24 | 44 | 0.35 | 0.44 | 0 | 5–6 | 0.34 | 0.45 | 0 | 8–9 | 0.3 | 0.39 | 0 | 9–1 |
| e) * | 1 | 0.135 | −15 | 30 | 45 | — | — | — | — | — | — | — | — | — | — | — | 7 |
| f) | 1 | 0.15 | −7 | 41 | 48 | 0.43 | 0.45 | 0 | 4–5 | 0.41 | 0.47 | 0 | 7–8 | 0.34 | 0.44 | 0 | 8–9 |
| g) | 1 | 0.175 | 18 | 55 | 33 | 0.43 | 0.46 | 0.41 | 4–5 | 0.47 | 0.46 | 0.05 | 5–6 | 0.45 | 0.46 | 0 | 7–8 |
| h) | 1 | 0.20 | 34 | 66 | 32 | 0.44 | 0.46 | 0.40 | 3–4 | 0.46 | 0.47 | 0.31 | 5–6 | 0.46 | 0.47 | 0 | 7–8 |
| i) | 1 | 0.225 | 49 | 78 | 29 | 0.45 | 0.48 | 0.41 | 3–4 | 0.47 | 0.48 | 0.37 | 4–5 | 0.47 | 0.48 | 0.15 | 5–6 |

* Interpolated

Compositions e and f of this invention exhibited zero remanent polarization at all three temperatures. Composition f (85% PMN, 15% PT, 1% La) had the broadest operating range (48° C.), with an ample allowance on each side of room temperature, i.e., −7° to 41° C. Composition e had the lowest $T_d$ (−20° C.), while still having a sufficient margin above 25° C., for a total range of 44° C. Composition g had the highest $T_{max}$ (55° C.), while still having a sufficient margin below 25° C., for a total operating temperature range of 33° C.

Figure 8:
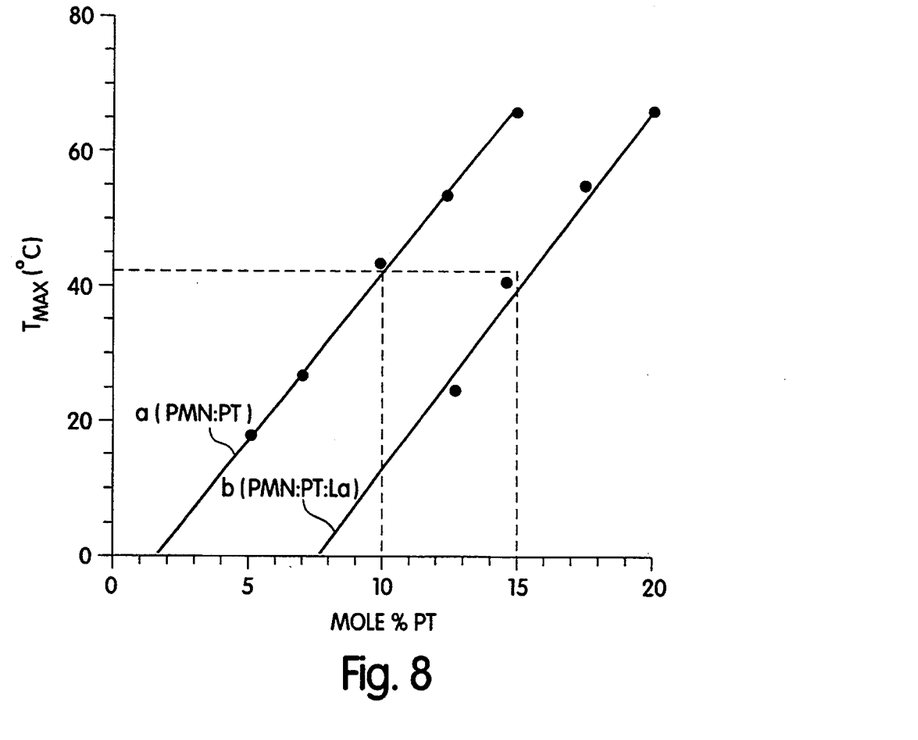
FIG. 8 is a graph showing the change in $T_{max}$ measured at 1 kHz for a PMN—PT system with increasing mole % PT, with and without 1 mole % La; to achieve a given $T_{max}$—e.g., about 40° C., compound (a) will have 90:10 of PMN:PT, and compound (b) will have 85:15 of PMN:PT and 1 mole % La.

FIG. 8 compares the effect of mole % PT on $T_{max}$ (at 1 KHZ), for the prior art composition without La (curve a: PMN:PT of 90:10), and for the composition of this invention (curve b: PMN:PT:La of 85:15:1). For a defined $T_{max}$, as shown, the optimum mole % PT differs between curves a and b.

Figure 9:
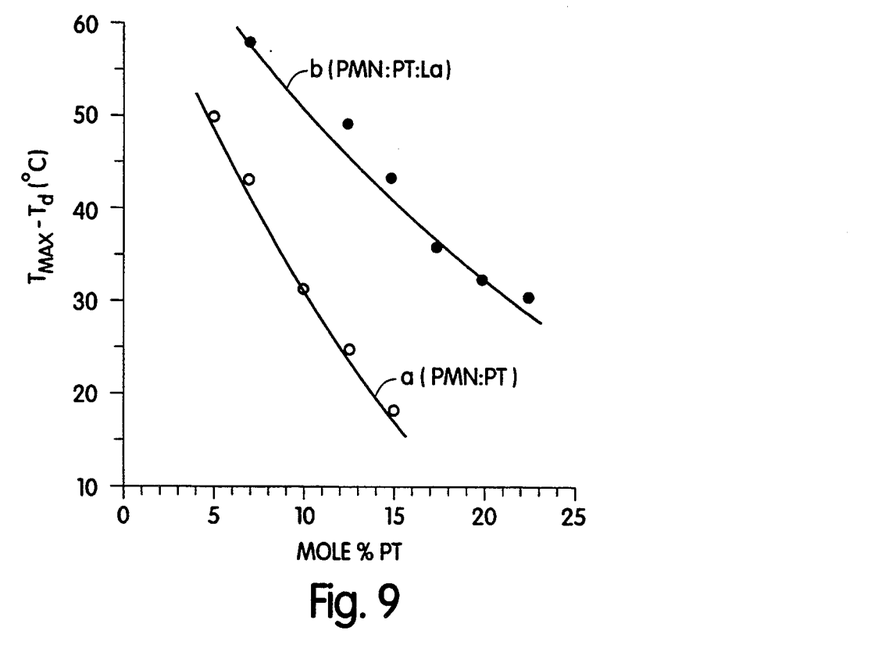
FIG. 9 is a graph showing the operating temperature range ($T_{max} - T_d$) for PMN—PT with and without 1 mole % La.

FIG. 9 compares the effect of mole % PT on the operating temperature range ($T_{max} - T_d$), for the prior art composition without La (curve a: PMN:PT of 90:10) and for the composition of this invention (curve b: PMN:PT:La of 85:15:1).

tially described in N. Kim et al., "Dielectric and Piezoelectric Properties of Lanthanum-Modified Lead Magnesium Niobium-Lead Titanate Ceramics," *Ferroelectrics*, 1989, Vol. 93, pp. 341–349, which is incorporated herein by reference.

Figure 13:
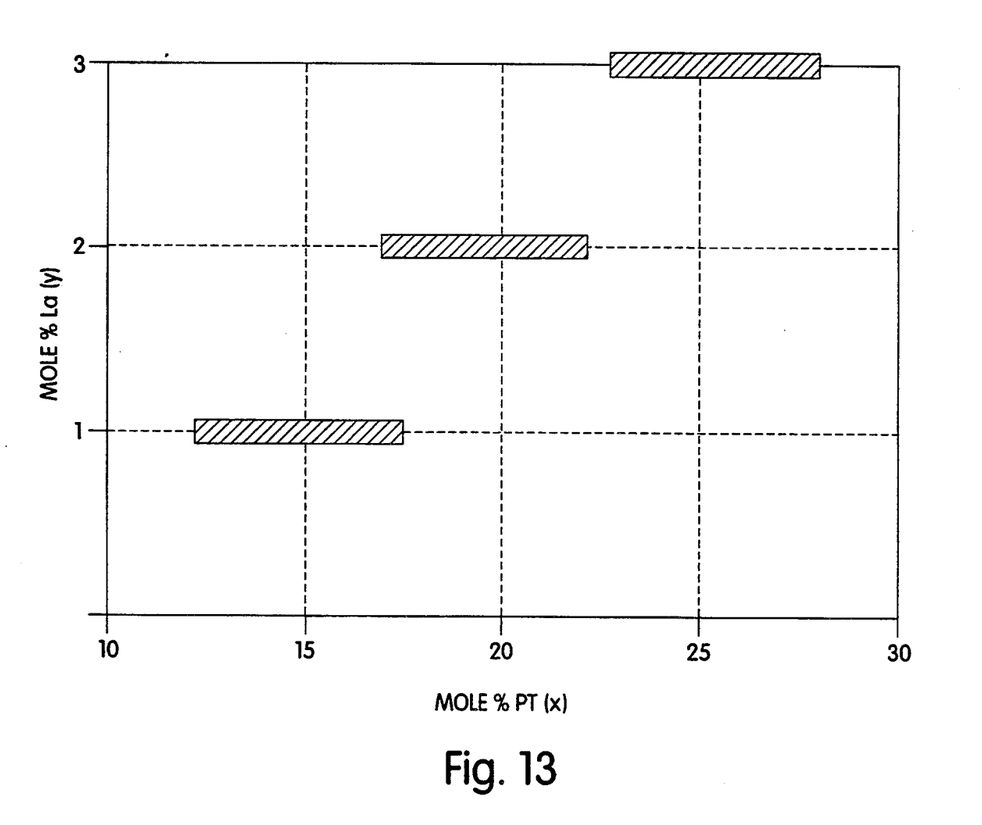
FIG. 13 is a graph showing the preferred PMN—PT composition ranges of this invention.

Other preferred compositions of this invention are shown in FIG. 13, within the desired ranges of x on the order of 10–30 mole % and y on the order of 0.5–3 mole %. The three preferred room temperature operating range compositions are:

(a) y on the order of 1 mole % and x on the order of 12.5–17.5 mole %;

(b) y on the order of 2 mole % and x on the order of 17–22 mole %; and (c) y on the order of 3 mole % and x on the order of 23–28 mole %.

Figure 14:
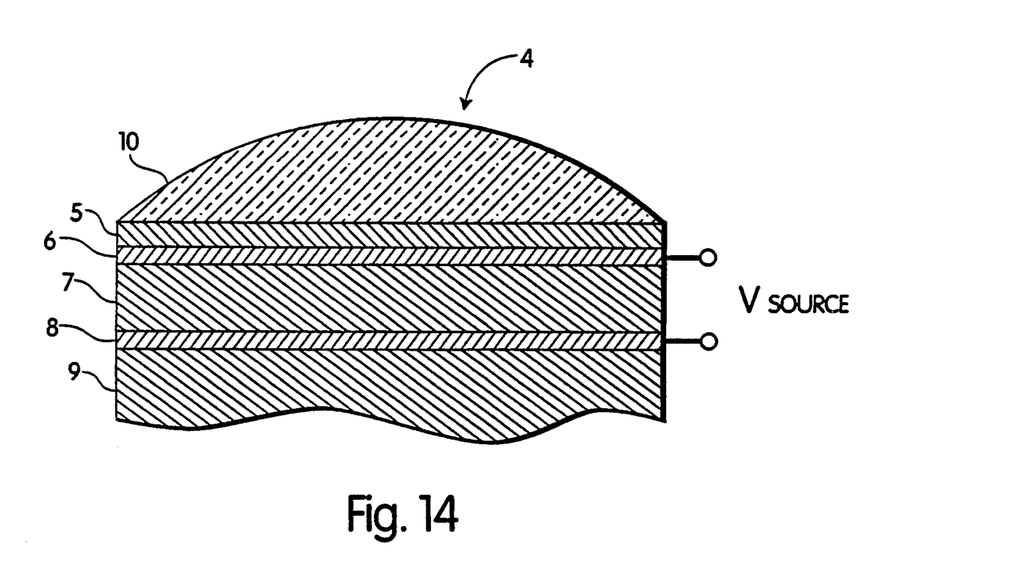
FIG. 14 is a cross-sectional view of an ultrasonic probe incorporating the PMN—PT composition of this invention.

FIG. 14 shows one embodiment of a medical ultrasonic imaging probe 4 for transmitting and receiving ultrasonic energy incorporating the transducer material of this invention. The probe has a relatively thick, impedance-matching backing layer 9, i,e., a damping layer with an appropriate acoustic impedance to optimize the sensitivity, bandwidth or pulse length of the transducer. The transducer 7 has electrical conducting contact layers 6 and 8 on its opposing sides, and the composite is mounted on top of the backing layer 9. The bias and excitation voltages are applied across the transducer layer 7 as shown. An impedance matching layer (or layers) 5 may be provided above the transducer and finally a lens 10 above layer 5 for focussing the acoustic beam. Acoustic energy generated in the transducer array is transmitted through the impedance matching layer 5, focussed by lens 10 and sent into the object under examination, i.e., the human body.

Figure 15:
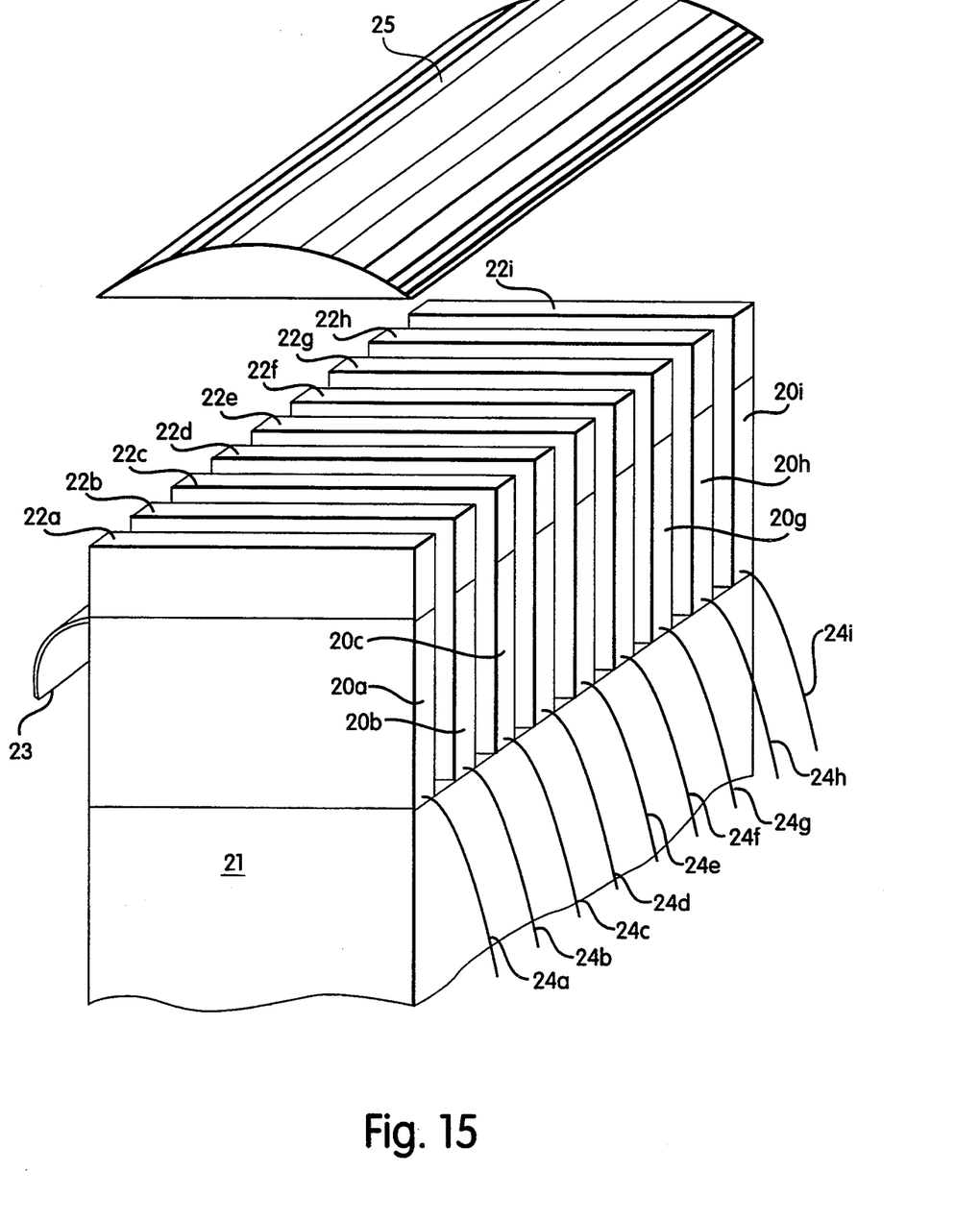
FIG. 15 is a perspective view of an ultrasonic probe having an array of transducer elements made from the PMN—PT composition of this invention.

Alternatively, the probe may include an array of tens or hundreds of transducer elements arranged on a backing layer, each element being physically separated so it can be individually energized (FIG. 15). In this embodiment, separate parallel and spaced transducer elements 20a et seq. are arranged between backing material 21 and separate acoustic matching layers 22a et seq. The field is applied by common electrode 23 and a plurality of connections 24a et seq. for poling in the designated thickness direction. An acoustic lens 25 is provided above acoustic matching layers 22.

Figure 16A:
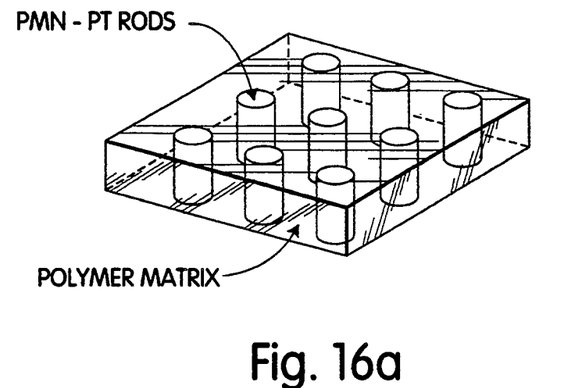
FIG. 16a is a schematic representation of a 1:3 PMN—PT rod:polymer composite made from the PMN—PT composition of this invention.
Figure 16B:
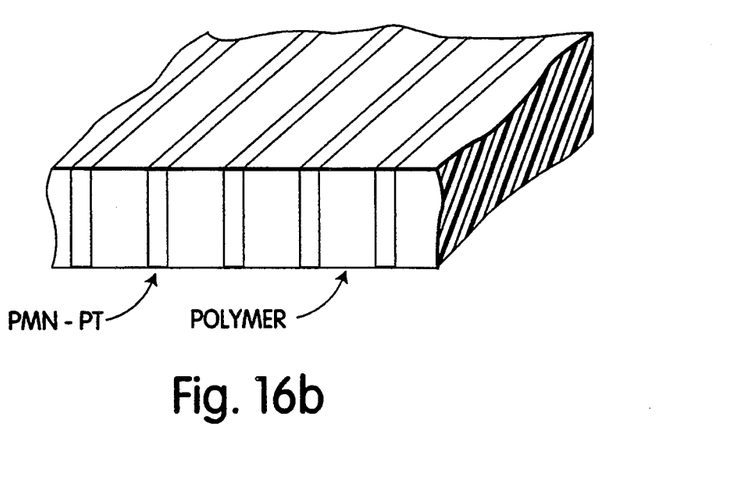
FIG. 16b is a schematic representation of a 2:2 PMN—PT:polymer composite.

The transducer of this type may have applications other than as a probe with controllable sensitivity, as previously described. Other applications include use as a variable aperture probe, e.g., an ultrasonic beam is electronically scanned in the X-direction and controlled in the Y-direction by a bias voltage. Another application is as a two-dimensional array, e.g., a crossed-array electrode type 2D probe, wherein the piezo-active region can be selected in space and in time by a DC bias field switching and a selected region is mechanically isolated by a passive polymer. It may also be desirable to utilize the lanthanum doped PMN—PT compositions of this invention as a composite material (i.e., mixed with a polymer such as epoxy or polyurethane) in order to, for example, improve coupling of acoustic energy from the transducer to the body, or to reduce unwanted lateral vibrations when used in array ultrasonic transducers. Such a composite configuration is shown in FIGS. 16a and 16b, wherein the PMN—PT composition of this invention is provided as rods in a 1:3 rod:polymer composite (FIG. 16a), or as layers in a 2:2 PMN—PT:polymer composite (FIG. 16b).

While there have been shown and described what are presently considered the preferred embodiments of the present invention, it will be obvious to those skilled in the art that various changes may be made therein without departing from the scope of the invention as defined by the appended claims. For example, while the preferred embodiment was directed towards increasing the stability and sensitivity with temperature of an electrostrictive ultrasonic transducer operated in the vicinity of room temperature (25° C.), similar benefits may be realized for operating temperatures above or below room temperature through modifications of the ratios of PMN, PT and lanthanum.

What is claimed is:

1. In an ultrasonic probe having an electrostrictive transducer for transmitting and receiving ultrasonic energy, and having electrical contacts attached to the transducer for connection to a source that selectively applies an electric field to the transducer, the improvement comprising:
   the transducer being fabricated from a material comprising a solid solution of lead magnesium niobate PMN and lead titanate PT and being doped with lanthanum La according to the formula:

$$Pb_{1-(3/2)y}La_y\square_{y/2}[(Mg_{1/3}Nb_{2/3})_{1-x}Ti_x]O_3 \qquad (I)$$

wherein x and y are on the order of
   $10 \leq x \leq 30$ mole %
   $0.5 \leq y \leq 3$ mole %.
   and $\square$ represents a vacancy at the Pb site, wherein the transducer provides an expanded operating temperature range.

2. The probe of claim 1, wherein the transducer provides an expanded operating temperature range around room temperature and includes a solid solution selected from the group consisting of:
   (a) y on the order of 1 mole % and x on the order of 12.5–17.5 mole %;
   (b) y on the order of 2 mole % and x on the order of 17–22 mole %; and
   (c) y on the order of 3 mole % and x on the order of 23–28 mole %.

3. The probe of claim 2, wherein x is on the order of 15% and y is on the order of 1%.

4. The probe of claim 2, wherein x is on the order of 17.5% and y is on the order of 1%.

5. The probe of claim 2, wherein x is on the order of 13.5% and y is on the order of 1%.

6. The probe of claim 1, wherein the transducer comprises a composite of polymer and the PMN:PT:La solid solution.

7. An electrostrictive transducer for transmitting and receiving ultrasonic energy, comprising:
   a backing layer;
   at least one electrostrictive transducer element disposed on the backing layer; and
   electrical contacts attached to the transducer element and connectable to a source for selectively producing electric fields in the transducer element,
   wherein the transducer is fabricated from a material comprising a solid solution of lead magnesium niobate PMN and lead titanate PT and is doped with lanthanum La according to the formula:

$$Pb_{1-(3/2)y}La_y\square_{y/2}[(Mg_{1/3}Nb_{2/3})_{1-x}Ti_x]O_3 \qquad (I)$$

wherein x and y are on the order of
   $10 \leq x \leq 30$ mole %
   $0.5 \rightarrow y \leq 3$ mole %.
   and $\square$ represents a vacancy at the Pb site, wherein the transducer provides an expanded operating temperature range.

8. The transducer of claim 7, wherein the transducer provides an expanded operating temperature range around room temperature and includes a solid solution selected from the group consisting of:
   (a) y on the order of 1 mole % and x on the order of 12.5–17.5 mole %;
   (b) y on the order of 2 mole % and x on the order of 17–22 mole %; and
   (c) y on the order of 3 mole % and x on the order of 23–28 mole %.

9. The transducer of claim 8, wherein x is on the order of 13.5 to 17.5 mole % and y is on the order of 1 mole %.

10. A method of expanding the operating temperature range of an ultrasonic probe comprising:
    providing an electrostrictive transducer for transmitting and receiving ultrasonic energy, and electrical contacts attached to the transducer for connection to a source that selectively applies an electric field to the transducer, wherein the transducer comprises a solid solution of lead magnesium niobate PMN and lead titanate PT; and selecting the relative mole % of PMN and PT and doping with a mole % lanthanum La according to the formula:

$$Pb_{1-(3/2)y}La_y\square_{y/2}[(Mg_{1/3}Nb_{2/3})_{1-x}Ti_x]O_3 \quad (I)$$

wherein x and y are on the order of
$10 \leqq x \leqq 30$ mole %
$0.5 \leqq y \leqq 3$ mole %.

and $\square$ represents a vacancy at the Pb site, in order to expand the operating temperature range.

11. The method of claim 10, wherein the transducer provides an expanded operating temperature range around room temperature and includes solid solutions selected from the group consisting of:

(a) y on the order of 1 mole % and x on the order of 12.5–17.5 mole %;

(b) y on the order of 2 mole % and x on the order of 17–22 mole %; and (c) y on the order of 3 mole % and x on the order of 23–28 mole %.

12. The method of claim 11, wherein x is on the order of 13.5 to 17.5 mole % and y is on the order of 1 mole %.

* * * * *